(12) United States Patent
Ma et al.

(10) Patent No.: US 12,105,150 B2
(45) Date of Patent: Oct. 1, 2024

(54) SOC ESTIMATION METHOD, MOBILE POWER SUPPLY AND READABLE STORAGE MEDIUM

(71) Applicant: SHENZHEN POWEROAK NEWENER CO., LTD, Shenzhen (CN)

(72) Inventors: Hui Ma, Shenzhen (CN); Jianhua Lei, Shenzhen (CN); Xianren Li, Shenzhen (CN); Xiangzhu Yin, Shenzhen (CN)

(73) Assignee: SHENZHEN POWEROAK NEWENER CO., LTD, Shenzhen (CN)

( * ) Notice: Subject to any disclaimer, the term of this patent is extended or adjusted under 35 U.S.C. 154(b) by 0 days.

(21) Appl. No.: 18/239,200

(22) Filed: Aug. 29, 2023

(65) Prior Publication Data

US 2023/0400519 A1 Dec. 14, 2023

Related U.S. Application Data

(63) Continuation of application No. PCT/CN2023/084108, filed on Mar. 27, 2023.

(30) Foreign Application Priority Data

Apr. 2, 2022 (CN) .......................... 202210345240.X

(51) Int. Cl.
 *G01R 31/367* (2019.01)
 *G01R 31/3832* (2019.01)
 *H01M 10/44* (2006.01)
 *H02J 7/00* (2006.01)

(52) U.S. Cl.
 CPC ....... *G01R 31/367* (2019.01); *G01R 31/3832* (2019.01); *H01M 10/44* (2013.01); *H02J 7/0048* (2020.01)

(58) Field of Classification Search
 None
 See application file for complete search history.

(56) References Cited

FOREIGN PATENT DOCUMENTS

| CN | 100401614 C | * | 7/2008 | .......... G01R 31/396 |
|----|-------------|---|--------|------------------------|
| CN | 103217649 A |   | 7/2013 |                        |
| CN | 104391249 A |   | 3/2015 |                        |
| CN | 110361668 A |   | 10/2019|                        |
| CN | 114252788 A |   | 3/2022 |                        |

\* cited by examiner

*Primary Examiner* — Roy Y Yi
(74) *Attorney, Agent, or Firm* — SCULLY, SCOTT, MURPHY & PRESSER, P.C.

(57) ABSTRACT

An SOC estimation method includes calculate an electric quantity value of fixed step size for the mobile power supply, and then sequentially superimpose a unit electric quantity step by step to calculate an accumulated electric quantity from the last moment of SOC change, then compare the absolute value of the accumulated electric quantity with the electric quantity value of the fixed step size to determine whether the SOC value is added/subtracted the fixed step size or kept unchanged, and acquire an initial value of the accumulated electric quantity at the next moment. In above method, the division operation can be replaced by "if judgment" and addition/subtraction operations in actual programming, which greatly reduces the calculation amount for SOC estimation, thereby greatly reducing requirements for chip operational power and peripheral resources and equipment energy consumption, improving the speed and computing stability of SOC estimation.

20 Claims, 6 Drawing Sheets

SOC ESTIMATION METHOD, MOBILE POWER SUPPLY AND READABLE STORAGE MEDIUM

CROSS-REFERENCE TO RELATED APPLICATIONS

The present application claims the benefit of and priority to Chinese Patent Application No. 202210345240.X, filed with the Chinese Patent Office on Apr. 2, 2022, titled "SOC ESTIMATION METHOD, MOBILE POWER SUPPLY AND READABLE STORAGE MEDIUM", which is hereby incorporated by reference in its entirety.

TECHNICAL FIELD OF THE INVENTION

The present application relates to the technical field of SOC estimation for a mobile power supply, and in particular, relates to an SOC estimation method, a mobile power supply and a readable storage medium.

BACKGROUND OF THE INVENTION

At present, for portable and miniature energy storage products in the market, major manufacturers have begun to look for cheaper substitute materials due to the high cost of electronic products. When choosing the substitute materials, usually chips with low price and weak operational power are chosen or the peripheral resources and performance of chips are constantly compressed. However, for miniature and mobile power products, they involve many operations, such as state of charge (SOC) estimation, and only chips with high performance, strong operational power and fast operational speed are applicable. If we only pursue low-cost chips without simplifying operations, adaptation and compatibility inevitably cannot be achieved.

In the operation of the chips, the operation overhead required for SOC estimation is large. In the prior art, the ampere-hour integration method is widely used for SOC estimation, and the formula thereof is as follows:

$$SOC = SOC_0 - \frac{1}{C}\int_0^t \eta I d\tau,$$

wherein C is the rated capacitance, η is the charging or discharging efficiency, and I is the current.

In this algorithm, operations such as addition, subtraction, multiplication and division are involved, the operation overhead is huge, and chips with low price and weak operational power cannot meet operation requirements thereof, and thus a low-cost SOC estimation algorithm is urgently needed.

SUMMARY OF THE INVENTION

A technical solution adopted by an embodiment of the present application is to provide an SOC estimation method which is applied to a mobile power supply, and the method includes:

step S1: calculating an electric quantity value of a fixed step size for the mobile power supply;

step S2: sequentially superimposing a unit electric quantity step by step to calculate an accumulated electric quantity of the mobile power supply from the last moment of SOC change;

step S3: comparing the absolute value of the accumulated electric quantity with the electric quantity value of the fixed step size, and performing addition and subtraction operations based on the comparison result to acquire an SOC value at the current moment and an initial value of the accumulated electric quantity at the next moment;

step S4: cycling the steps S2 to S3 when the accumulated electric quantity continues to change after the SOC value is updated; and maintaining the SOC value at the previous moment and saving the accumulated electric quantity of the current moment when the accumulated electric quantity does not change any more.

Preferably, the step S1 includes: acquiring the electric quantity value of the fixed step size for the mobile power supply according to a first formula; wherein the first formula is:

$$\Delta C = C \times P \times \lambda, \text{ and } \Delta C > \int_0^{T_2} I_{max} dt$$

wherein, $\Delta C$ is an electric quantity value of a fixed step size, C is rated capacity of a battery of the mobile power supply, P is a fixed step size, $\lambda$ is a proportional coefficient changing with the ambient temperature, $I_{max}$ is the maximum over-charge value that the mobile power supply can bear in extreme cases, and $T_2$ is an SOC calculation period of the mobile power supply.

Preferably, the step S2 includes calculating the unit electric quantity according to a second formula; wherein the second formula is:

$$\Delta Q_n = \frac{I_{n1} + I_{n2} + \ldots + I_{nk}}{k} \times T_2$$

wherein $$k = \text{Int}\left(\frac{T_2}{T_1}\right);$$

$I_{n1}, I_{n2}, \ldots, I_{nk}$ are sampling currents respectively.

Preferably, the step S2 includes calculating the accumulated electric quantity of the mobile power supply from the last moment of SOC change according to a third formula; wherein the third formula is:

$$Q_n = Q_{st} + \sum_{n=1}^{N} \Delta Q_n$$

wherein $Q_{st}$ represents an initial value of the accumulated electric quantity, and N is a positive integer.

Preferably, the step S3 includes: when the absolute value of the accumulated electric quantity is greater than or equal to the electric quantity value of the fixed step size, adding or subtracting the fixed step size on the basis of the SOC value at the previous moment to obtain the current SOC value according to charging or discharging states of the mobile power supply, and subtracting the electric quantity value of the fixed step size from the accumulated electric quantity or adding the electric quantity value of the fixed step size to the accumulated electric quantity to obtain the initial value of the accumulated electric quantity at the next moment according to the charging or discharging states of the mobile power supply; when the absolute value of the accumulated electric quantity is less than the electric quantity value of the fixed step size, keeping the SOC value at the previous moment as the current SOC value, and saving the accumulated electric quantity as the initial value of the accumulated electric quantity at the next moment.

Preferably, the method further includes correcting the SOC value at the current moment obtained in the step S3 at the end stage of charging and discharging of the mobile power supply.

Preferably, the step of correcting the SOC of the mobile power supply at the end stage of charging and discharging of the mobile power supply includes:

in the charging process of the mobile power supply, introducing the following correction process if the voltage U of the mobile power supply is greater than a voltage threshold $U_{up}$ at the end of charging and the SOC value of the mobile power supply is not full:

$$SOC'=SOC+\alpha(U-U_{up})$$

wherein SOC' is the corrected SOC value during charging; SOC is the SOC value before correction; and $\alpha$ is a charging correction parameter.

Preferably, the step of correcting the SOC of the mobile power supply at the end stage of charging and discharging of the mobile power supply includes:

in the discharging process of the mobile power supply, introducing the following correction process if the voltage U of the mobile power supply is less than a voltage threshold $U_{de}$ at the end of discharging and the SOC value of the mobile power supply is not emptied:

$$SOC''=SOC+\beta(U_{de}-U)$$

wherein SOC'' is the corrected SOC value during discharging; SOC is the SOC value before correction; and $\beta$ is a discharging correction parameter.

Another technical solution adopted by an embodiment of the present application is to provide a mobile power supply, and the mobile power supply includes: at least one processor; and a memory communicatively connected with the at least one processor; wherein the memory stores instructions executable by the at least one processor, and the instructions, when executed by the at least one processor, enable the at least one processor to execute the state of charge (SOC) calculation method.

Another technical solution adopted by an embodiment of the present application is to provide a readable storage medium, and the readable storage medium stores computer-executable instructions which enable a computer to execute the SOC calculation method.

BRIEF DESCRIPTION OF DRAWINGS

One or more embodiments are illustrated by corresponding attached drawings, and this does not constitute limitation on the embodiments, elements with the same reference numerals in the attached drawings are indicated as similar elements, and the pictures in the attached drawings do not constitute scale limitation unless otherwise stated particularly.

DETAILED DESCRIPTION OF THE INVENTION

In order to make objectives, technical solutions and advantages of the present application clearer, the present application will be further described in detail hereinafter with reference to attached drawings and embodiments. It shall be appreciated that, the specific embodiments described herein are only used to explain the present application, and are not used to limit the present application.

It shall be noted that, all features in the embodiments of the present application may be combined with each other without conflict, and all the combinations are within the scope claimed in the present application. In addition, although functional module division is made in the schematic diagrams of the device and logical sequences are shown in the flowchart diagrams, in some cases, the steps shown or described may be executed with module division and sequences different from those in the schematic diagrams of the device and the flowchart diagrams.

Unless otherwise defined, all technical and scientific terms used in this specification have the same meanings as commonly understood by those skilled in the art of the present application. The terms used in the specification of the present application are only for the purpose of describing specific embodiments, and are not intended to limit the present application. The term "and/or" used in this specification includes any and all combinations of one or more associated items listed.

The mobile power supply in the present application refers to a portable and miniature energy storage power supply which has a screen display (which can display an SOC value) and is capable of supplying power for digital products and small household appliances.

Figure 1:
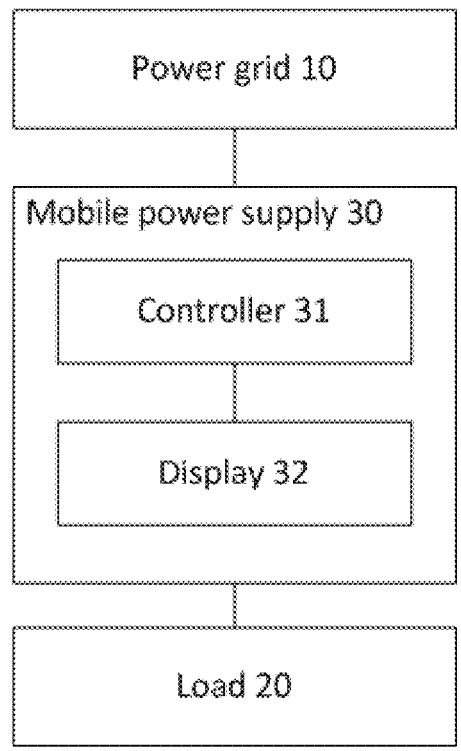
FIG. 1 is a schematic view of an application scenario according to an embodiment of the present application.

The SOC estimation method and device can be applied to the SOC estimation process of the mobile power supply. As shown in FIG. 1, which shows an application scenario provided according to an embodiment of the present application, the application scenario includes a power grid 10, a load 20, and a mobile power supply 30, the mobile power supply 30 is connected with the power grid 10 and the load 20 respectively, the mobile power supply 30 includes a controller 31 and a display 32, and the controller 31 is connected with the display 32. The mobile power supply 30 refers to a portable charger capable of storing electric energy by itself, the working states of the mobile power supply 30 include charging and discharging, the power grid 10 is used for charging the mobile power supply 30 and the mobile power supply 30 is used for discharging the load 20; when the mobile power supply 30 is charged or discharged, the controller 31 controls the display 32 to display the current SOC value of the mobile power supply 30, i.e., the current electric quantity of the mobile power supply 30, wherein the contents displayed by the display 32 including but not limited to numbers from 1 to 100, and the number displayed on the display 32 gradually increases when the mobile power supply 30 is charged; while the number displayed on the display 32 gradually decreases when the mobile power supply 30 is discharged. Further speaking, the SOC value refers to the ratio of the remaining capacity of the mobile power supply to the capacity of the mobile power supply when it is fully charged, and the SOC value ranges from 0% to 100%; when the SOC value is equal to 0%, it means that the mobile power supply is fully discharged, and when the SOC value is 100%, it means that the mobile power supply is fully charged; and by learning the SOC value, the operation of the mobile power supply can be controlled.

In this embodiment, the battery capacity of the mobile power supply is C, the SOC range of the mobile power supply displayed by the display is 0% to 100%, and the accuracy of the SOC value may be 1%, 0.1%, or 0.01% according to actual needs, and the smaller the accuracy is, the higher the accuracy of SOC estimation will be. In practical application, the SOC range may only display numbers without displaying units; therefore, in order to facilitate the simple view of numbers, the accuracy of the SOC value may be set to 1, and the SOC range may be adjusted to 0%-100%, 0‰-1000‰ or 0‰₀-10000‰₀ according to needs, so the display will display numbers of 0 to 100, 0 to 1000, or 0 to 10000.

The power grid 10 may be commercial power or any equipment capable of charging the mobile power supply 30. The load 20 includes, but is not limited to, electronic products of handheld mobile equipment such as wireless phone and notebook computer.

Figure 2:
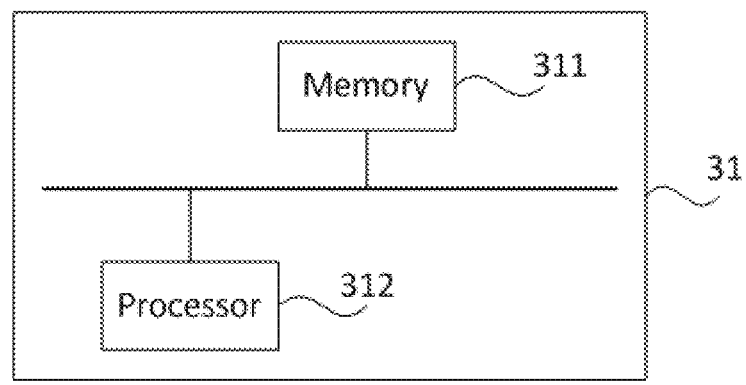
FIG. 2 is a schematic structural diagram of a controller for executing an SOC estimation method according to an embodiment of the present application.

In an embodiment of the present application, as shown in FIG. 2, the controller 31 described above includes at least one processor 311, with one processing 311 being taken as an example in FIG. 2; and a memory 321 communicatively connected with the at least one processor 311, wherein the connection is achieved by bus connection as an example in FIG. 2.

The memory 321 stores instructions executable by the at least one processor 311, and the instructions are executed by the at least one processor 311 so that the at least one processor 311 can execute the SOC estimation method described below.

As a nonvolatile computer-readable storage medium, the memory 321 may be used to store nonvolatile software programs, nonvolatile computer-executable programs and modules, such as program instructions/modules corresponding to the SOC estimation method in the embodiment of the present application. The processor 311 executes various functional applications and data processing of the mobile power supply 30, i.e., implements the SOC estimation method in the embodiment of the method described below, by running nonvolatile software programs, instructions and modules stored in the memory 321.

The memory 321 may include a program storage area and a data storage area, wherein the program storage area may store operating systems and application programs required by at least one function. In addition, the memory 321 may include a high-speed random access memory, and may also include a nonvolatile memory. For example, the memory 321 includes at least one magnetic disk memory device, flash memory device, or other nonvolatile solid-state memory devices. In some embodiments, the memory 321 optionally includes memories remotely provided relative to the processor 311.

The one or more modules are stored in the memory 321, and the one or more modules, when executed by the one or more processors 311, execute the SOC estimation method in any of the embodiments of the method described below, e.g., execute the steps of the method in FIG. 3 described below.

The mobile power supply 30 is also connected with other devices for better executing the method provided according to the embodiment of the present application; for example, the mobile power supply 30 may be electrically connected with a display screen or other displays, or it may be connected remotely and communicatively with the communication equipment of the target user, and this will not be enumerated herein.

The mobile power supply 30 described above may execute the method provided according to the embodiment of the present application, and have corresponding functional modules for executing the method. For technical details not described in detail in this embodiment, reference may be made to the method provided according to the embodiment of the present application.

Figure 3:
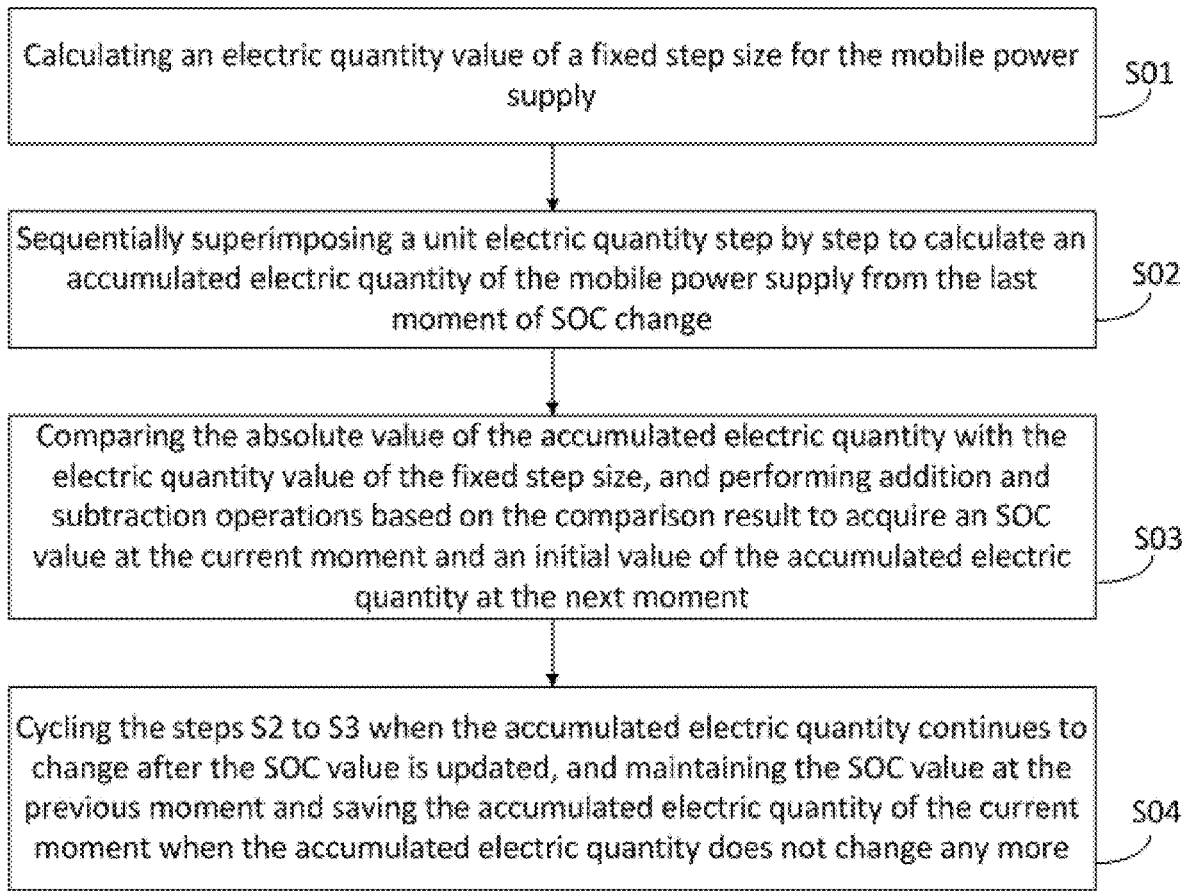
FIG. 3 is a flowchart diagram of an SOC estimation method according to an embodiment of the present application.
Figure 4:
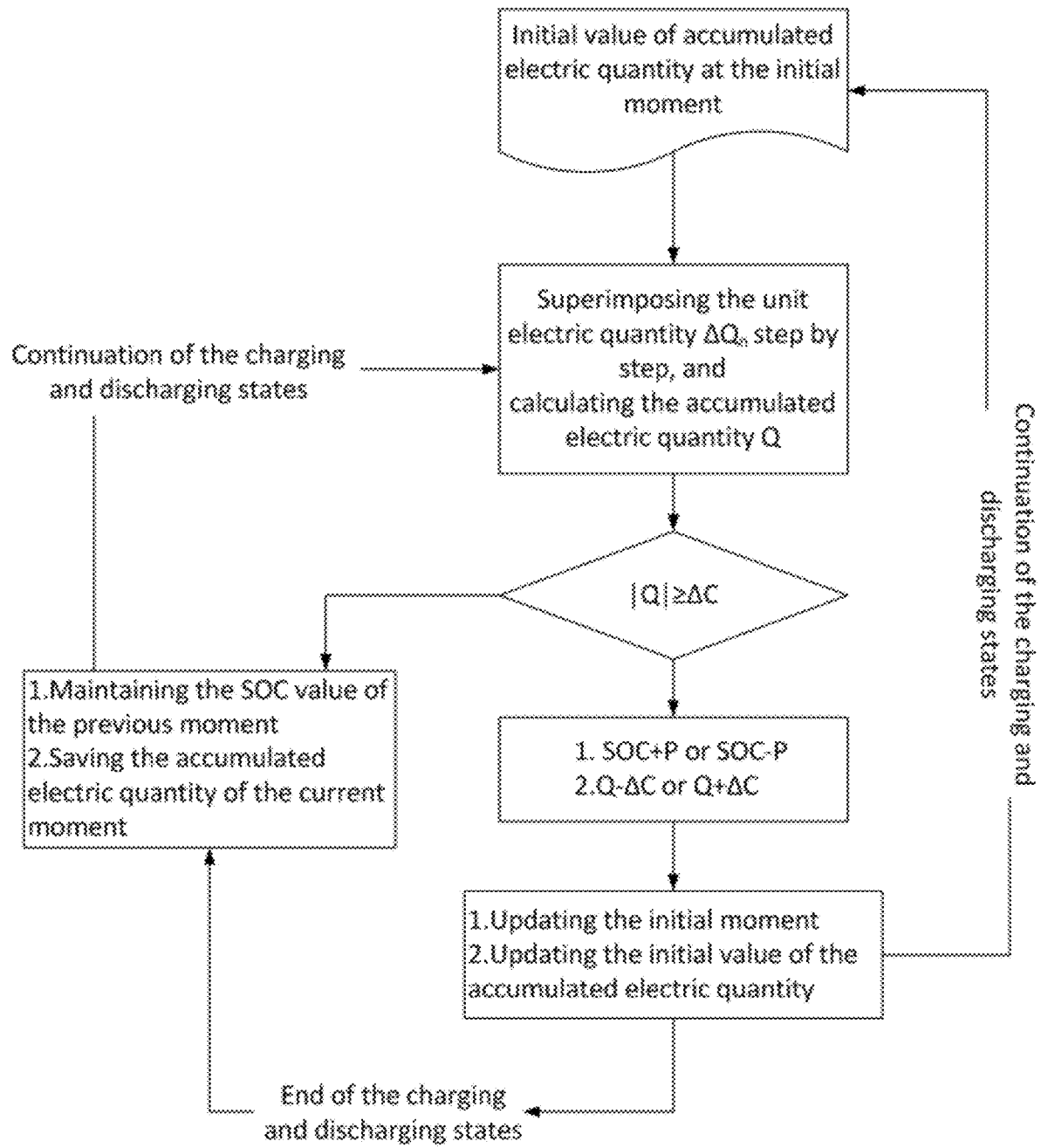
FIG. 4 is a schematic process diagram of an SOC estimation method according to an embodiment of the present application.

Please refer to FIG. 3 and FIG. 4, wherein FIG. 3 is a flowchart diagram of an SOC estimation method according to an embodiment of the present application, FIG. 4 is a schematic view of an SOC estimation process according to an embodiment of the present application, the method is applied to the above-mentioned mobile power supply, and as shown in FIG. 3, the method includes the following steps.

S01: calculating an electric quantity value of a fixed step size for the mobile power supply.

Considering the influence of temperature on charging and discharging of the battery, the environmental temperature factor is taken into consideration for the electric quantity value of the fixed step size, that is, temperature correction is carried out. Specifically, the electric quantity value of the fixed step size of the mobile power supply is calculated according to the following formula; wherein the formula is:

$$\Delta C = C \times P \times \lambda$$

wherein $\Delta C$ is an electric quantity value of a fixed step size, and C is rated capacity of a battery of the mobile power supply. P is a fixed step size which is expressed as a unit range and capable of reflecting the accuracy of SOC; the higher the accuracy is, the smaller the P value will be, and P is specifically a certain percentage value; for example, when the SOC range is 1‰ to 1,000‰, the value of P is 1‰, i.e., 0.1%; and when the SOC range is 1% to 100%, the value of P is 1%. $\lambda$ is a proportional coefficient (ranging from 0 to 1) that varies with the ambient temperature; for example, when the external ambient temperature is detected to be below 0 degrees Celsius, $\lambda = 0.8$; and when the external ambient temperature is detected to be above 0 degrees Celsius, $\lambda = 1$. The setting of ranges of variation for the P value and $\lambda$ needs to satisfy the following condition:

$$\Delta C > \int_0^{T_2} I_{max} dt$$

wherein $I_{max}$ is the maximum over-charge value that the mobile power supply can bear in extreme cases, and $T_2$ is an SOC calculation period of the mobile power supply. Because in the method described herein, the SOC sequentially plus or minus the fixed step size P, and the maximum amount of change for SOC within each calculation period is P, it is necessary to ensure that the accumulated electric quantity within a period $T_2$ is less than $\Delta C$ when the mobile power supply is charged or discharged at the maximum current.

S02: sequentially superimposing a unit electric quantity step by step to calculate an accumulated electric quantity of the mobile power supply from the last moment of SOC change.

Specifically, the unit electric quantity is sequentially superimposed step by step according to the unit time, and the accumulated electric quantity Q of the mobile power supply from the last moment of SOC change is calculated.

Optionally, in this embodiment, the unit time is the calculation period $T_2$ of SOC for the mobile power supply, and the calculation period $T_2$, the current sampling period $T_1$ and the sampling current I of SOC for the mobile power supply need to be acquired first in order to obtain the unit electric quantity. The smaller the current sampling period $T_1$ is, the more it can reflect the real change; however, in the practical application, considering the performance and necessity of the chip in the mobile power supply (such as the case with slow change, like temperature), the current sampling period $T_1$ may be at the level of hundred second/millisecond or second, while the sampling current I may be at the level of millisecond or microsecond; preferably, the current sampling period $T_1$ may be 10 ms. If the value of the SOC calculation period $T_2$ is too small, the amount of calculation will be too large, and if the value of the SOC calculation period $T_2$ is too large, the SOC change of the mobile power supply may be not smooth enough; optionally, the value of the SOC calculation period $T_2$ may be 100 ms. The current sampling period $T_1$ and SOC calculation period $T_2$ may be adjusted and set according to actual situations.

Specifically, the SOC calculation period $T_2$ of the mobile power supply is much longer than the sampling period $T_1$ of the mobile power supply, so there are multiple current sampling periods $T_1$ within one SOC calculation period $T_2$, and the sampling current in each current sampling period $T_1$ may be different, so the unit electric quantity $\Delta Q_n$ in each SOC calculation period is expressed by the following formula in an integral manner:

$$\Delta Q_n > \int_0^{T_2} I dt$$

wherein $\Delta Q_n$ refers to the unit electric quantity within a certain SOC calculation period $T_2$.

However, considering the actual programming implementation, it is necessary to discretize the above-mentioned integral formula, that is, to average the multiple currents for sampling so as to obtain the constant current within the calculation period $T_2$:

$$\Delta Q_n = \frac{I_{n1} + I_{n2} + \ldots + I_{nk}}{k} \times T_2$$

$$k = \text{Int}\left(\frac{T_2}{T_1}\right)$$

Wherein $I_{n1}$, $I_{n2}$, ..., $I_{nk}$ are sampling currents respectively.

In the above formula, although the k value can be acquired simply by one division operation, it involves a division operation after all, and in order to reduce the operation overhead, the k value is further optimized as follows:

$$k=2^j, \text{ and } T_1 \times k \leq T_2$$

wherein j is a positive integer. k is taken as the exponential power of 2, and the advantage of this setting is that the chip performs a binary number operation, and when the divisor is the exponential power of 2, it can speed up the operation by moving left instead of performing division operation.

It shall be appreciated that, because the sampling current I corresponding to each sampling period $T_1$ is definitely different, each unit electric quantity will be different accordingly.

The accumulated electric quantity for a certain current moment is the sum of the accumulated electric quantity at the previous moment and the unit electric quantity, wherein $Q_n = Q_{n-1} + \Delta Q_n$.

The time difference between the current moment and the previous moment is $T_2$, $Q_n$ represents the accumulated electric quantity at the current moment, $Q_{n-1}$ represents the accumulated electric quantity at the previous moment, and $\Delta Q_n$ represents the unit electric quantity from the previous moment to the current moment.

When the last moment of SOC change is taken as the initial moment, the above formula is further transformed into the following formula:

$$Q_n = Q_{st} + \sum_{n=1}^{N} \Delta Q_n$$

wherein $Q_{st}$ represents an initial value of the accumulated electric quantity, and N is a positive integer.

It shall be appreciated that, the above-mentioned unit time may be set according to actual needs, for example, the unit time is set to $2T_2$ or $3T_2$, and the unit electric quantity changes accordingly. The larger the unit time is, the smaller the number of comparisons in the subsequent step S03 will be, and the operation overhead of the chip can also be reduced to some extent.

S03: comparing the absolute value of the accumulated electric quantity with the electric quantity value of the fixed step size, and performing addition and subtraction operations based on the comparison result to obtain an SOC value at the current moment and an initial value of the accumulated electric quantity at the next moment.

Specifically, the absolute value of the accumulated electric quantity is compared with the electric quantity value of the fixed step size, and whenever the absolute value of the accumulated electric quantity is greater than or equal to the electric quantity value of the fixed step size, the fixed step size is added or subtracted on the basis of the SOC value at the previous moment to obtain the current SOC value according to charging or discharging states of the mobile power supply, and the electric quantity value of the fixed step size is added to or subtracted from the accumulated electric quantity to obtain the initial value of the accumulated electric quantity at the next moment according to the charging or discharging states of the mobile power supply; when the absolute value of the accumulated electric quantity is less than the electric quantity value of the fixed step size, the SOC value of the previous moment is kept as the current SOC value, and the accumulated electric quantity is saved as the initial value of the accumulated electric quantity at the next moment.

As shall be appreciated from the above description, when the absolute value of the accumulated electric quantity is less than the electric quantity value of the fixed step size, it is equivalent to that addition and subtraction operations have been performed, except that the number added or subtracted is 0.

When the mobile power supply works, the mobile power supply will acquire the charging or discharging states and the processor will periodically acquire the accumulated electric quantity of the mobile power supply. When the mobile power supply is in the charging state, the input is greater than the output, and the accumulated electric quantity is positive; while the mobile power supply is in the discharging state, the input is less than the output, and the accumulated electric quantity is negative.

Specifically, after each SOC calculation period $T_2$, the accumulated electric quantity Q is compared with the electric quantity value $\Delta C$ of the fixed step size.

When $|Q| \geq \Delta C$, and the mobile power supply is in a charging state, the fixed step size is added on the basis of the SOC value at the previous moment to obtain the current SOC value, and the electric quantity value of the fixed step size is subtracted from the accumulated electric quantity to obtain the initial value of the accumulated electric quantity at the next moment; When $|Q| \geq \Delta C$, and the mobile power supply is in a discharging state, the fixed step size is subtracted on the basis of the SOC value at the previous moment to obtain the current SOC value, and the electric quantity value of the fixed step size is added to the accumulated electric quantity to obtain the initial value of the accumulated electric quantity at the next moment.

S04: cycling the steps S02 to S03 when the accumulated electric quantity continues to change after the SOC value is updated; and maintaining an SOC value at the previous moment and saving the accumulated electric quantity of the current moment when the accumulated electric quantity does not change any more.

Specifically, when the mobile power supply is charged or discharged, the accumulated electric quantity will change continuously, and when the mobile power supply stops being charged or discharged, the accumulated electric quantity will not change. Each time the steps S02 to S03 are cycled once, the initial moment for calculating the accumulated electric quantity in the step S02 will change once, and the initial moment is updated to the moment of each SOC change, and the initial value of the accumulated electric quantity is correspondingly updated to Q–$\Delta C$.

Figure 5:
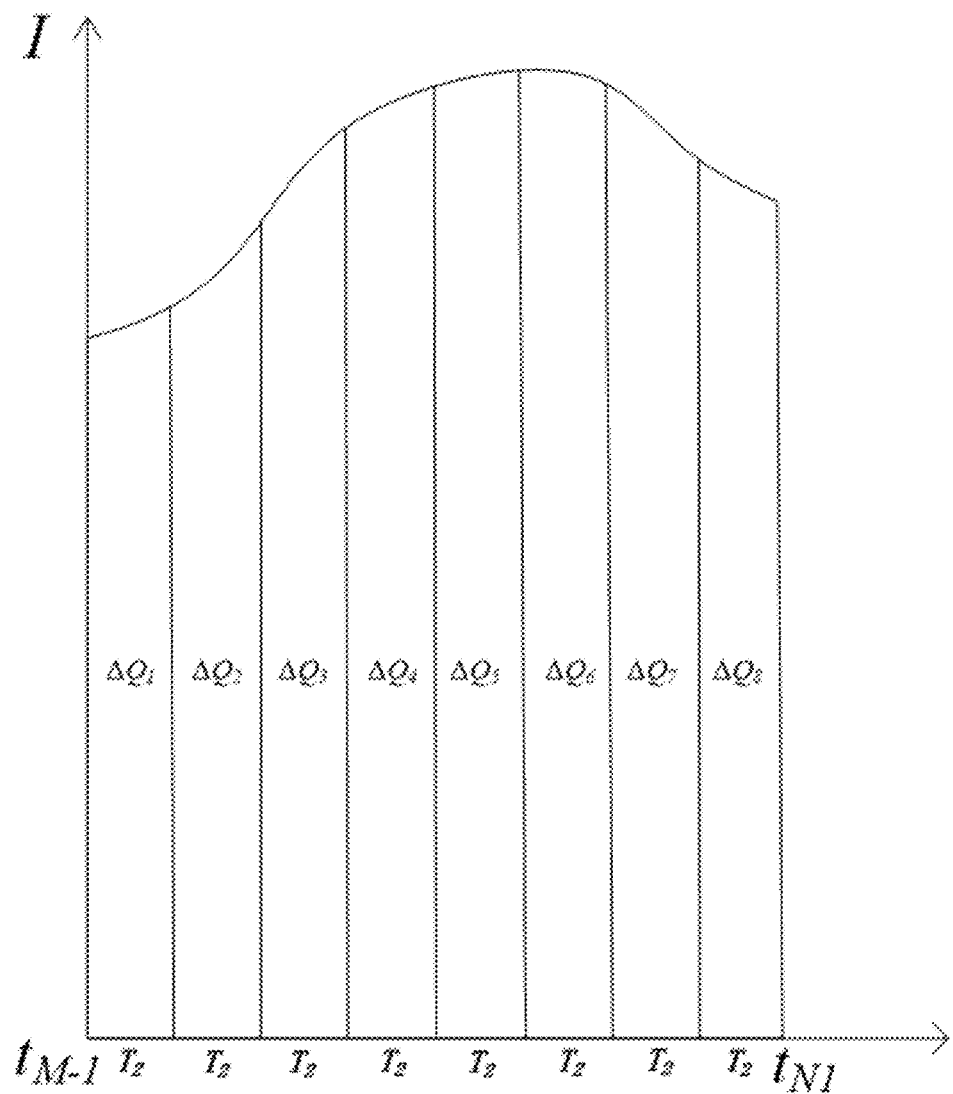
FIG. 5 is a schematic view illustrating the accumulated electric quantity of a mobile power supply according to an embodiment of the present application from the beginning of charging to a certain moment.
Figure 6:
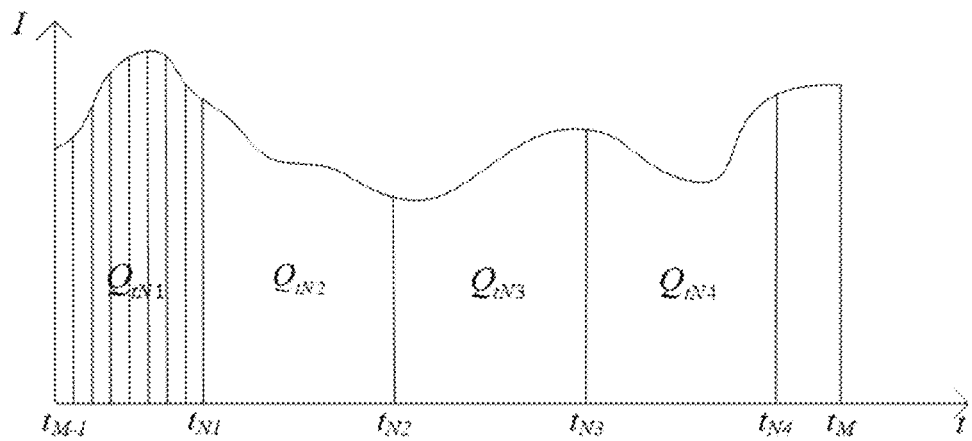
FIG. 6 is a schematic view illustrating the accumulated electric quantity of the mobile power supply according to the embodiment of the present application from the beginning of charging to the end of charging.

Schematic views illustrating the process of the steps S02 to S04 in the SOC estimation process are shown as follows by taking the case where the mobile power supply is charged at the room temperature as an example. FIG. 5 is a schematic view illustrating the accumulated electric quantity from the beginning of charging to a certain moment in the charging process of the mobile power supply. FIG. 6 is a schematic view illustrating the total accumulated electric quantity from the beginning of charging to the end of charging in the charging process of the mobile power supply.

As shown in FIG. 5 and FIG. 6, the moment $t_{M-1}$ is the initial moment of a certain charging of the mobile power supply, $t_{N1}$ is a certain moment in the charging process, and $t_M$ is the moment when the charging stops. It is assumed that the SOC value at the initial moment of charging is 23.4% and the fixed step size P is 0.1%.

During the charging process, the current will be sampled in every current sampling period $T_1$ in order to obtain real-time current; in each SOC calculation period $T_2$, the unit electric quantity within this period will be calculated first, and then the accumulated electric quantity and SOC will be calculated.

For the unit electric quantity in each SOC calculation period $T_2$, the calculation formula is as follows:

$$\Delta Q_n = \frac{I_{n1} + I_{n2} + \ldots + I_{nk}}{k} \times T_2$$

wherein k=8, and n=1, 2, . . . , 8.

The accumulated electric quantity is calculated after each SOC calculation period, and the accumulated electric quantity is compared with the electric quantity value $\Delta C$ of the fixed step size; in this example, the initial value of the accumulated electric quantity is 0, then: each of $\Delta Q_1$, $\Delta Q_1 + \Delta Q_2$, $\Delta Q_1 + \Delta Q_2 + \Delta Q_3$, $\Delta Q_1 + \Delta Q_2 + \Delta Q_3 + \Delta Q_4$, . . . , $\Delta Q_1 + \Delta Q_2 + \ldots + \Delta Q_8$ is compared with $\Delta C$. It is assumed that in this example, $\Delta Q_1 + \Delta Q_2 + \ldots + \Delta Q_7 < \Delta C$ and $\Delta Q_1 + \Delta Q_2 + \ldots + \Delta Q_7 + \Delta Q_8 \geq \Delta C$, then at the moment $t_{N1}$, the SOC value is the SOC value at the moment $t_{M-1}$ plus the fixed step size P, i.e., 23.5%; then, the electric quantity value of the fixed step size is subtracted from the accumulated electric quantity to obtain the initial value of the accumulated electric quantity at the next moment, i.e., $Q_{tN1} - \Delta C$, wherein $Q_{tN1} = \Delta Q_1 + \Delta Q_2 + \ldots + \Delta Q_8$.

As shown in FIG. 6, during the continuous charging of the mobile power supply, the accumulated electric quantity continues to change, and the above processes continue to be cycled; it shall be noted that, for the moment $t_{N2}$, the initial moment for calculating the accumulated electric quantity thereof is updated to $t_{N1}$, the initial value of the accumulated electric quantity is $Q_{tN1} - \Delta C$, and the accumulated electric quantity is the electric quantity accumulated from the moment $t_{N1}$ to the moment $t_{N2}$; similarly, for the moments of $t_{N3}$, $t_{N4}$ and $t_M$, each time the SOC value is changed once, the initial moment for calculating the accumulated electric quantity thereof is updated to the last moment of SOC change, and the initial value of the accumulated electric quantity is updated to the accumulated electric quantity at the last moment of SOC change minus $\Delta C$, and the accumulated electric quantity is the electric quantity accumulated from the last moment of SOC change to the current moment.

By the moments of $t_{N2}$, $t_{N3}$ and $t_{N4}$, the accumulated electric quantities $Q_{tN2}$, $Q_{tN3}$ and $Q_{tN4}$ are greater than or equal to $\Delta C$ respectively, so the SOC values of $t_{N2}$, $t_{N3}$ and $t_{N4}$ are 23.6%, 23.7% and 23.8% respectively, and at the moment $t_{N4}$, $Q_{tN4} - \Delta C$ is taken as the initial value of the accumulated electric quantity at the next moment. By the moment $t_M$, the accumulated electric quantity $Q_{tM} < \Delta C$, so the SOC value at the moment $t_M$ is kept as the SOC at the previous moment $t_{N4}$, i.e., 23.8%, and the accumulated electric quantity at the current moment is saved as the initial value of the accumulated electric quantity at the next moment of change of electric quantity.

For the operation overhead of chips, remainder>division>multiplication>subtraction>addition, and for some cheap chips with low operational power, especially for those chips without hardware divider, the division operation involving large numbers will be a great expense, and this calculation method is not conducive to the stability of calculation. By adopting the above SOC estimation algorithm in the present application, the original division operation can be replaced simply by using if judgment and addition and subtraction operations in actual programming, which greatly reduces the calculation amount for SOC estimation, reduces the consumption of computing resources and the occupation of storage space (in the practical application, some low-end 8-bit, 5-16K Flash chips may be used), thereby greatly reducing requirements for chip operational power and peripheral resources, reducing equipment energy consumption, improving the speed of SOC estimation and improving the computing stability.

In some embodiments, the method further includes correcting the SOC value obtained in the step S04 at the end stage of charging and discharging of the mobile power supply.

According to voltage characteristics at the end of charging and discharging for lithium iron phosphate, the battery voltage will show a trend of rapid voltage rise and rapid voltage drop in full charged and full discharged stages. Therefore, the SOC is corrected at the end stage of charging and discharging.

For example, according to battery characteristics, a voltage threshold $U_{up}$ corresponding to the end of charging and a voltage threshold $U_{de}$ corresponding to the end of discharging are respectively set.

When the voltage U of the mobile power supply does not exceed the range between $U_{up}$ and $U_{de}$, it is considered that the SOC of the mobile power supply is not full or not empty, so the SOC value obtained in the step S04 does not need to be corrected.

When the voltage U of the mobile power supply is greater than $U_{up}$ and the SOC is not full in the charging process, the following correction process is introduced:

$$SOC'=SOC+\alpha(U-U_{up})$$

wherein SOC' is the corrected SOC value during charging; SOC is the SOC value before correction; and a is the charging correction parameter, which may be determined in the actual test.

When the voltage U of the mobile power supply is less than $U_{de}$ and the SOC is not empty in the discharging process, the following correction process is introduced:

$$SOC''=SOC+\beta(U_{de}-U)$$

wherein SOC" is the corrected SOC value during discharging; SOC is the SOC value before correction; and β is the discharging correction parameter, which may be determined in the actual test.

It shall be appreciated that, in order to further improve the accuracy, two voltage thresholds $U_{up1}$ and $U_{up2}$ corresponding to the end of charging and two voltage thresholds $U_{de1}$ and $U_{de2}$ corresponding to the end of discharging may be set respectively according to the battery characteristics, and the corresponding correction parameters α1, α2, β1 and β2 may be obtained through actual tests.

Figure 7:
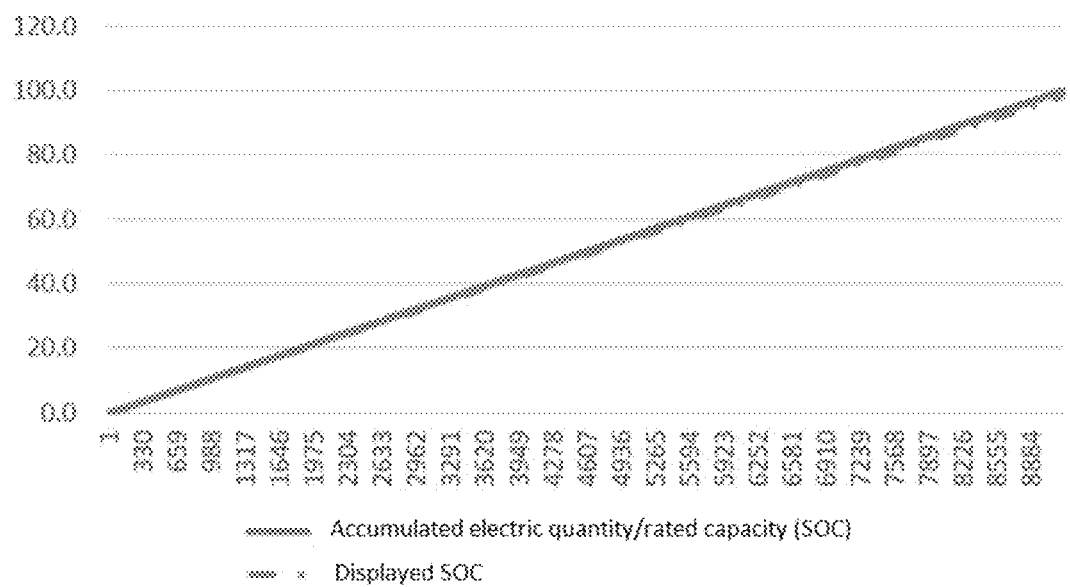
FIG. 7 is a comparison diagram of SOC estimation curves during charging of the mobile power supply according to the embodiment of the present application.

An experiment is carried out according to the above SOC estimation method, a mobile power supply with rated capacity of 5.4 Ah is adopted to be charged at the room temperature, the SOC is estimated respectively by using the traditional ampere-hour integration method and the above method in the present application, the comparison diagram for the obtained SOC estimation curves is as shown in FIG. 7, in which the accumulated electric quantity/rated capacity expressions use the ampere-hour integration method.

As can be seen from FIG. 7, during charging, the SOC curves obtained by the two methods are highly coincident, especially at the end of charging, and the corrected SOC estimation value is also highly coincident with the SOC estimation curve graph obtained by the ampere-hour integration method, which indicates that high estimation accuracy is achieved by using the SOC estimation method of the present application.

Figure 8:
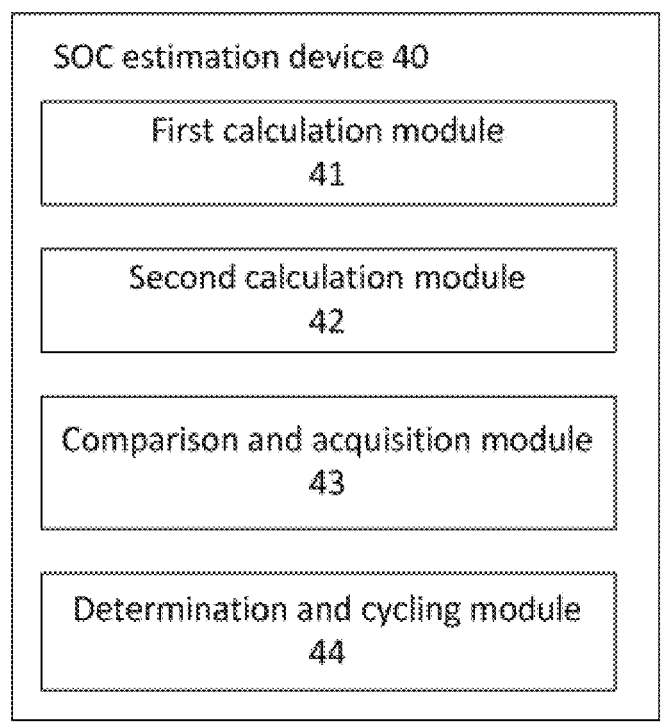
FIG. 8 is a structural block diagram of an SOC estimation device provided according to an embodiment of the present application.

Please refer to FIG. 8, which is a structural block diagram of an SOC estimation device according to an embodiment of the present application, and as shown in FIG. 8, an SOC estimation device 40 includes a first calculation module 41, a second calculation module 42, a comparison and acquisition module 43 and a determination and cycling module 44.

The first calculation module 41 is configured to calculate an electric quantity value of a fixed step size for the mobile power supply. The second calculation module 42 is configured to sequentially superimpose the unit electric quantity step by step and calculate the accumulated electric quantity of the mobile power supply from the last moment of SOC change. The comparison and acquisition module 43 is configured to compare the absolute value of the accumulated electric quantity with the electric quantity value of the fixed step size, and perform addition and subtraction operations based on the comparison result to acquire an SOC value at the current moment and an initial value of the accumulated electric quantity at the next moment. The determination and cycling module 44 is configured to determine whether the accumulated electric quantity continues to change after the SOC value is updated, and when the accumulated electric quantity continues to change, the determination and cycling module 44 controls to perform the following cycle: calculating an electric quantity value of a fixed step size for the mobile power supply by the first calculation module 41, sequentially superimposing the unit electric quantity step by step to calculate the accumulated electric quantity of the mobile power supply from the last moment of SOC change by the second calculation module 42, and comparing the absolute value of the accumulated electric quantity with the electric quantity value of the fixed step size, and performing addition and subtraction operations based on the comparison result to acquire an SOC value at the current moment and an initial value of the accumulated electric quantity at the next moment by the comparison and acquisition module 43; and when the accumulated electric quantity does not change any more, the SOC value of the previous moment is maintained and the accumulated electric quantity of the current moment is saved.

It shall be noted that, the SOC estimation device described above can execute the SOC estimation method provided according to the embodiment of the present application, and has corresponding functional modules and beneficial effects for executing the method. For technical details not described in detail in the embodiment of the SOC estimation device, reference may be made to the SOC estimation method provided according to the embodiment of the present application.

An embodiment of the present application further provides a nonvolatile computer readable storage medium which stores computer executable instructions, and the computer executable instructions are executed by one or more processors to for example execute the steps of the method in FIG. 3 and FIG. 4 described above and realize the functions of the modules in FIG. 8.

The embodiments of the device described above are only for illustrative purpose, wherein the units illustrated as separate components may be or may not be physically separated, and components displayed as units may be or may not be physical units; that is, these units and components may be located in one place or distributed over multiple network units. Some or all of the modules may be selected according to actual needs to achieve the purpose of the solution of the embodiment.

From the description of the above embodiments, those of ordinary skill in the art may clearly appreciate that each embodiment may be realized by means of software plus a general hardware platform, and of course, it may also be realized by hardware. As shall be appreciated by those of ordinary skill in the art, the implementation of all or part of the processes in the embodiments of the method described above may be completed by instructing related hardware through a computer program, the program may be stored in a computer readable storage medium, and the program may include the processes of the embodiments of the method described above when it is executed. The storage medium may be a magnetic disk, an optical disk, a Read-Only Memory (ROM) or a Random Access Memory (RAM) or the like.

Finally, it shall be noted that, the above embodiments are only used to illustrate the technical solutions of the present application, and are not intended to limit the present application; under the idea of the present application, technical features in the above embodiments or different embodiments may also be combined, the steps may be implemented in any order, and many other variations in different aspects of the present application as described above are possible, and these variations are not provided in details for conciseness; although the present application has been described in detail with reference to the foregoing embodiments, those of ordinary skill in the art shall appreciate that, the technical solutions described in the foregoing embodiments may still be modified or some of the technical features may be equivalently replaced; and these modifications or replacements do not make the essence of the corresponding technical solutions deviate from the scope of the technical solutions of various embodiments of the present application.

The invention claimed is:

1. A state of charge (SOC) estimation method for mobile power supply, comprising:
   step S1: calculating an electric quantity value of a fixed step size for the mobile power supply;
   step S2: sampling currents charging or discharging the mobile power supply at time intervals of a current sampling period, calculating a unit electric quantity based on the sampled currents, and sequentially superimposing the unit electric quantity step by step to calculate an accumulated electric quantity of the mobile power supply from the last moment of SOC change;
   step S3: comparing the absolute value of the accumulated electric quantity with the electric quantity value of the fixed step size, and performing addition and subtraction operations based on the comparison result to acquire an SOC value, at the current moment and an initial value of the accumulated electric quantity at the next moment;
   step S4: after the SOC value is updated, cycling the steps S2 and S3 when the accumulated electric quantity continues to change, and maintaining the updated SOC value at the previous moment and saving the accumulated electric quantity of the current moment when the accumulated electric quantity does not change; and
   controlling a display to display updated SOC values,
   wherein the step S3 further comprises:
      when the absolute value of the accumulated electric quantity is greater than or equal to the electric quantity value of the fixed step size, adding or subtracting the fixed step size on the basis of the SOC value at the previous moment to obtain the current SOC value according to charging or discharging states of the mobile power supply, and subtracting the electric quantity value of the fixed step size from the accumulated electric quantity or adding the electric quantity value of the fixed step size to the accumulated electric quantity to obtain the initial value of the accumulated electric quantity at the next moment according to the charging or discharging states of the mobile power supply; and
      when the absolute value of the accumulated electric quantity is less than the electric quantity value of the fixed step size, keeping the SOC value at the previous moment as the current SOC value, and saving the accumulated electric quantity as the initial value of the accumulated electric quantity at the next moment.

2. The method according to claim 1, wherein the step S1 comprises:
   acquiring the electric quantity value of the fixed step size for the mobile power supply according to a first formula; wherein the first formula is:

$$\Delta C = C \times P \times \lambda, \text{ and } \Delta C > \int_0^{T_2} I_{max} dt$$

wherein $\Delta C$ is an electric quantity value of a fixed step size, C is rated capacity of a battery of the mobile power supply, P is a fixed step size, $\lambda$ is a proportional coefficient changing with the ambient temperature, $I_{max}$ is the maximum over-charge value that the mobile power supply can bear in extreme cases, and $T_2$ is an SOC calculation period of the mobile power supply.

3. The method according to claim 1, wherein the step S2 comprises: calculating the unit electric quantity according to a second formula; wherein the second formula is:

$$\Delta Q_n = \frac{I_{n1} + I_{n2} + \ldots + I_{nk}}{k} \times T_2$$

wherein $$k = \text{Int}\left(\frac{T_2}{T_1}\right);$$

$I_{n1}, I_{n2}, \ldots, I_{nk}$ are the sampled currents respectively, $T_1$ is the current sampling period; $T_2$ is an SOC calculation period of the mobile power supply.

4. The method according to claim 1, wherein the step S2 comprises: calculating the unit electric quantity according to a second formula; wherein the second formula is:

$$\Delta Q_n = \frac{I_{n1} + I_{n2} + \ldots + I_{nk}}{k} \times T_2$$

wherein $k=2^j$ and $T_1 \times k \leq T_2$, j is a positive integer; $I_{n1}, I_{n2}, \ldots, I_{nk}$ are the sampled currents respectively, $T_1$ is the current sampling period; $T_2$ is an SOC calculation period of the mobile power supply.

5. The method according to claim 3, wherein the step S2 comprises:
   calculating the accumulated electric quantity of the mobile power supply from the last moment of SOC change according to a third formula; wherein the third formula is:

$$Q_n = Q_{st} + \sum_{n=1}^{N} \Delta Q_n$$

wherein $Q_{st}$ represents an initial value of the accumulated electric quantity, and N is a positive integer.

6. The method according to claim 4, wherein the step S2 comprises:
   calculating the accumulated electric quantity of the mobile power supply from the last moment of SOC change according to a third formula; wherein the third formula is:

$$Q_n = Q_{st} + \sum_{n=1}^{N} \Delta Q_n$$

wherein $Q_{st}$ represents an initial value of the accumulated electric quantity, and N is a positive integer.

7. The method according to claim 1, wherein the method further comprises:

correcting the SOC value at the current moment obtained in the step S3 at the end stage of charging and discharging of the mobile power supply.

8. The method according to claim 7, wherein the step of correcting the SOC of the mobile power supply at the end stage of charging and discharging of the mobile power supply comprises:

in the charging process of the mobile power supply, introducing the following correction process if the voltage U of the mobile power supply is greater than a voltage threshold $U_{up}$ at the end of charging and the SOC value of the mobile power supply is not full:

$$SOC'=SOC+\alpha(U-U_{up})$$

wherein SOC' is the corrected SOC value during charging; SOC is the SOC value before correction; and α is a charging correction parameter.

9. The method according to claim 7, wherein the step of correcting the SOC of the mobile power supply at the end stage of charging and discharging of the mobile power supply comprises:

in the discharging process of the mobile power supply, introducing a following correction process if the voltage U of the mobile power supply is less than a voltage threshold $U_{de}$ at the end of discharging and the SOC value of the mobile power supply is not emptied:

$$SOC''=SOC+\beta(U_{de}-U)$$

wherein SOC'' is the corrected SOC value during discharging; SOC is the SOC value before correction; and β is a discharging correction parameter.

10. A mobile power supply, wherein the mobile power supply comprises:

at least one processor and a memory communicatively connected with the at least one processor;

wherein the memory stores instructions executable by the at least one processor, and the instructions, when executed by the at least one processor, enable the at least one processor to execute the method according to claim 1.

11. A mobile power supply, wherein the mobile power supply comprises:

at least one processor and a memory communicatively connected with the at least one processor;

wherein the memory stores instructions executable by the at least one processor, and the instructions, when executed by the at least one processor, enable the at least one processor to execute the method according to claim 2.

12. A mobile power supply, wherein the mobile power supply comprises:

at least one processor and a memory communicatively connected with the at least one processor;

wherein the memory stores instructions executable by the at least one processor, and the instructions, when executed by the at least one processor, enable the at least one processor to execute the method according to claim 3.

13. A mobile power supply, wherein the mobile power supply comprises:

at least one processor and a memory communicatively connected with the at least one processor;

wherein the memory stores instructions executable by the at least one processor, and the instructions, when executed by the at least one processor, enable the at least one processor to execute the method according to claim 4.

14. A mobile power supply, wherein the mobile power supply comprises:

at least one processor and a memory communicatively connected with the at least one processor;

wherein the memory stores instructions executable by the at least one processor, and the instructions, when executed by the at least one processor, enable the at least one processor to execute the method according to claim 5.

15. A mobile power supply, wherein the mobile power supply comprises:

at least one processor and a memory communicatively connected with the at least one processor;

wherein the memory stores instructions executable by the at least one processor, and the instructions, when executed by the at least one processor, enable the at least one processor to execute the method according to claim 6.

16. A non-transitory computer-readable storage medium, wherein the non-transitory computer-readable storage medium stores computer-executable instructions which enable a computer to execute the method according to claim 1.

17. A non-transitory computer-readable storage medium, wherein the non-transitory computer-readable storage medium stores computer-executable instructions which enable a computer to execute the method according to claim 2.

18. A non-transitory computer-readable storage medium, wherein the non-transitory computer-readable storage medium stores computer-executable instructions which enable a computer to execute the method according to claim 3.

19. A non-transitory computer-readable storage medium, wherein the non-transitory computer-readable storage medium stores computer-executable instructions which enable a computer to execute the method according to claim 4.

20. A non-transitory computer-readable storage medium, wherein the non-transitory computer-readable storage medium stores computer-executable instructions which enable a computer to execute the method according to claim 5.

* * * * *